United States Patent
Yamada et al.

(10) Patent No.: US 12,224,230 B2
(45) Date of Patent: Feb. 11, 2025

(54) SEMICONDUCTOR DEVICES AND METHODS OF MANUFACTURING SEMICONDUCTOR DEVICES

(71) Applicant: Amkor Technology Singapore Holding Pte. Ltd., Valley Point (SG)

(72) Inventors: Yasuaki Yamada, Kumamoto (JP); Hidenari Sato, Kumamoto (JP)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 548 days.

(21) Appl. No.: 17/476,672

(22) Filed: Sep. 16, 2021

(65) Prior Publication Data

US 2023/0078615 A1 Mar. 16, 2023

(51) Int. Cl.
*H01L 23/495* (2006.01)
*H01L 21/56* (2006.01)
*H01L 23/00* (2006.01)
*H01L 23/31* (2006.01)

(52) U.S. Cl.
CPC ........ *H01L 23/49517* (2013.01); *H01L 21/56* (2013.01); *H01L 23/3121* (2013.01); *H01L 24/32* (2013.01); *H01L 24/40* (2013.01); *H01L 24/84* (2013.01); *H01L 2224/32503* (2013.01); *H01L 2224/40247* (2013.01); *H01L 2224/40507* (2013.01); *H01L 2224/84205* (2013.01)

(58) Field of Classification Search
None
See application file for complete search history.

(56) References Cited

U.S. PATENT DOCUMENTS

| | | | |
|---|---|---|---|
| 5,965,946 A | 10/1999 | Yano et al. | |
| 7,042,074 B2 | 5/2006 | Gobl et al. | |
| 7,667,307 B2 | 2/2010 | Muto et al. | |
| 7,944,058 B2 | 5/2011 | Ishihara | |
| 7,973,310 B2 | 7/2011 | Wang et al. | |
| 9,899,345 B2 | 2/2018 | Fujino et al. | |
| 2004/0135237 A1* | 7/2004 | Funato | H01L 23/49562 257/E23.044 |
| 2008/0265386 A1* | 10/2008 | Muto | H01L 24/78 257/676 |
| 2009/0286382 A1* | 11/2009 | Huff | H01L 24/83 438/455 |
| 2019/0122955 A1* | 4/2019 | Yoshida | H01L 23/40 |

FOREIGN PATENT DOCUMENTS

JP 2007250566 A * 9/2007 ............. H01L 24/75

* cited by examiner

*Primary Examiner* — Michelle Mandala
*Assistant Examiner* — Jordan M Klein
(74) *Attorney, Agent, or Firm* — Kevin B. Jackson

(57) ABSTRACT

In one example, a semiconductor device includes a substrate that comprises a substrate conductor material. An electronic component has a first component terminal that comprises a first component terminal conductor material and a second component terminal that comprises a second component terminal conductor material. An interconnect comprises an interconnect conductor material, a component end, and a substrate end. The second component terminal is attached to the substrate with a first intermetallic bond, the component end of the interconnect is attached to the first component terminal with a second intermetallic bond, and the substrate end of the interconnect is attached to the substrate with a third intermetallic bond. Other examples and related methods are also disclosed herein.

20 Claims, 12 Drawing Sheets

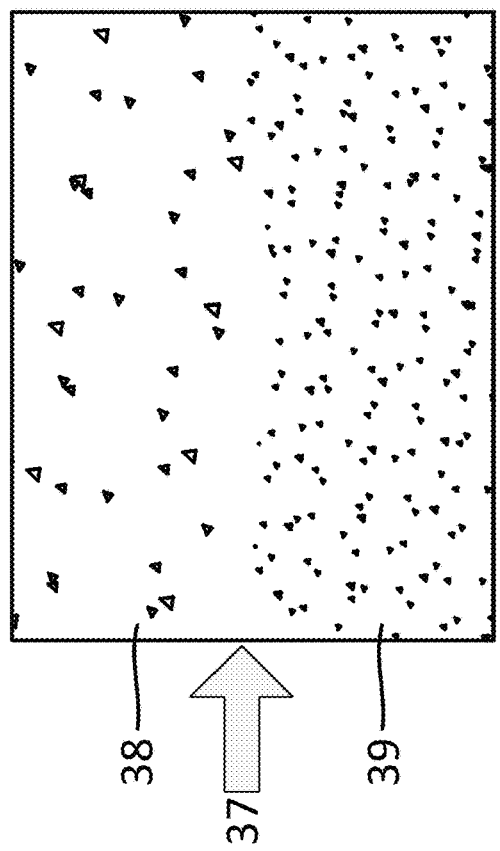
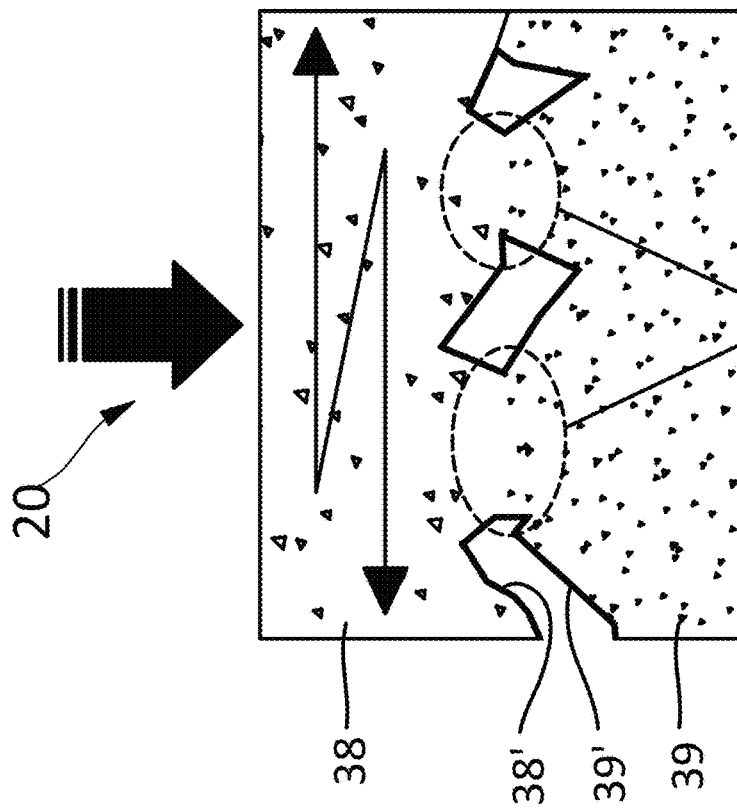

SEMICONDUCTOR DEVICES AND METHODS OF MANUFACTURING SEMICONDUCTOR DEVICES

CROSS-REFERENCE TO RELATED APPLICATIONS

Not Applicable.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 3A, 3B, 3C, and 3D show cross-sectional views of an example method of ultrasonic bonding for manufacturing an example electronic device.

Figure 1A:
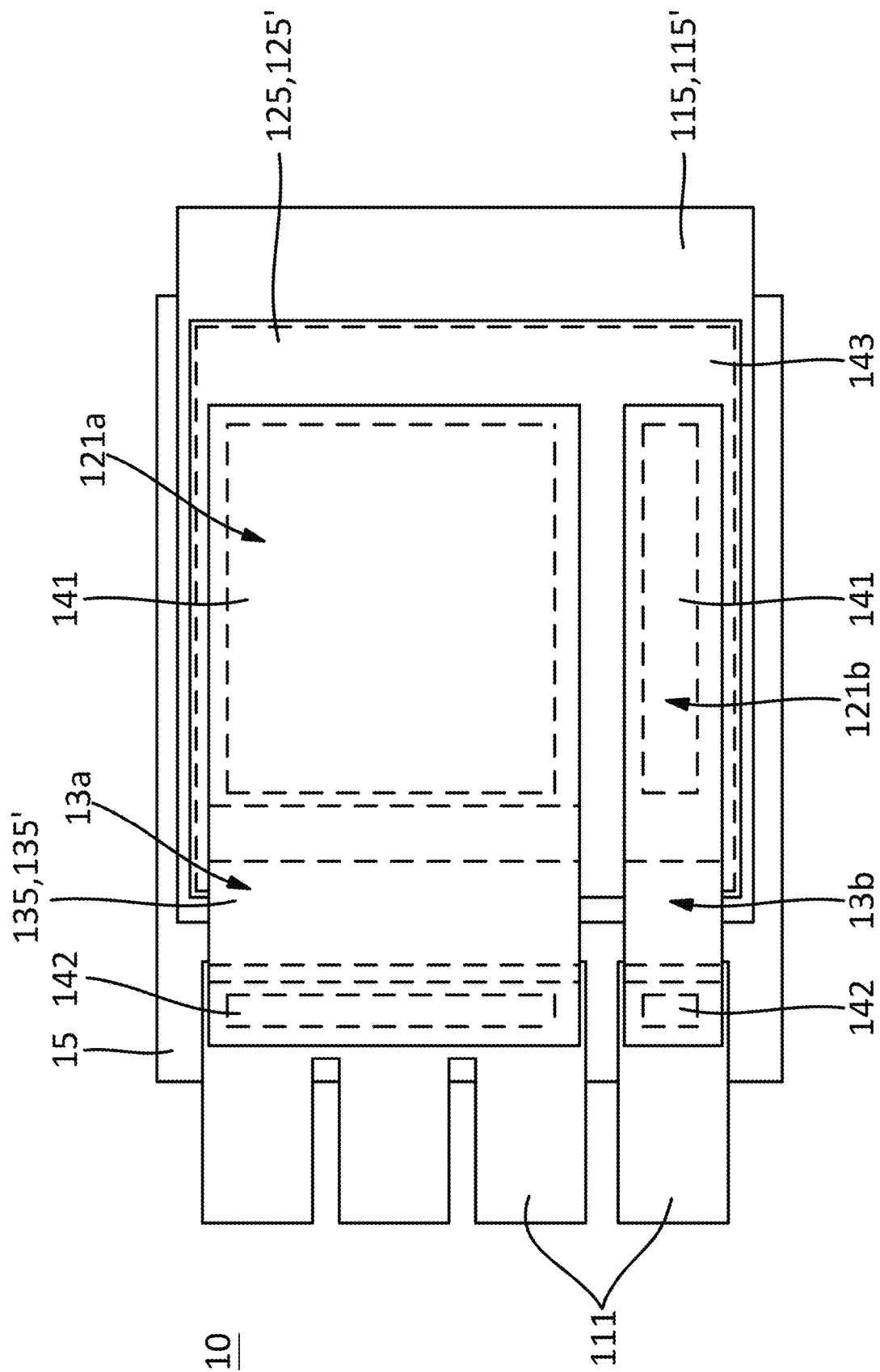
FIG. 1A shows a plan view of an example electronic device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

The present description includes, among other features, devices and associated methods that relate to semiconductor packaging. In some examples, multiple sub-components of a semiconductor package are interconnected using direct bonding at low temperature and low stress and without using solder.

In an example, a semiconductor device includes a substrate that comprises a substrate conductor material. An electronic component has a first component terminal that comprises a first component terminal conductor material and a second component terminal that comprises a second component terminal conductor material. An interconnect comprises an interconnect conductor material, a component end, and a substrate end. The second component terminal is attached to the substrate with a first intermetallic bond, the component end of the interconnect is attached to the first component terminal with a second intermetallic bond, and the substrate end of the interconnect is attached to the substrate with a third intermetallic bond.

In an example, a semiconductor device includes a substrate that comprises a substrate conductor material, a terminal, and a pad. An electronic component includes an electronic component top side, an electronic component bottom side opposite to the component top side, a first component terminal comprising a first component terminal conductor material adjacent to the electronic component top side, and a second component terminal comprising a second component terminal material adjacent to the electronic component bottom side. An interconnect comprises an interconnect conductor material, a component end, and a substrate end. The second component terminal is attached to the pad with a first intermetallic bond, the component end of the interconnect is attached to the first component terminal with a second intermetallic bond, and the substrate end of the interconnect is attached to the terminal with a third intermetallic bond.

In example, a method includes providing a substrate comprising a substrate conductor material and a substrate dielectric over the substrate conductor material. The method includes providing an electronic component that includes a first component terminal comprising a first component terminal conductor material, and a first component terminal dielectric over the first component terminal conductor material; and a second component terminal comprising a second component terminal conductor material, and a second component terminal dielectric over the second component terminal conductor material. The method includes providing an interconnect comprising an interconnect conductor material, a component end, a substrate end, and an interconnect dielectric over the interconnect conductor material. The method includes attaching the second component terminal to the substrate by forming a first intermetallic bond, attaching the component end of the interconnect to the first component terminal by forming a second intermetallic bond, and attaching the substrate end of the interconnect to the substrate by forming a third intermetallic bond.

Other examples are included in the present disclosure. Such examples may be found in the figures, in the claims, and/or in the description of the present disclosure.

Figure 1B:
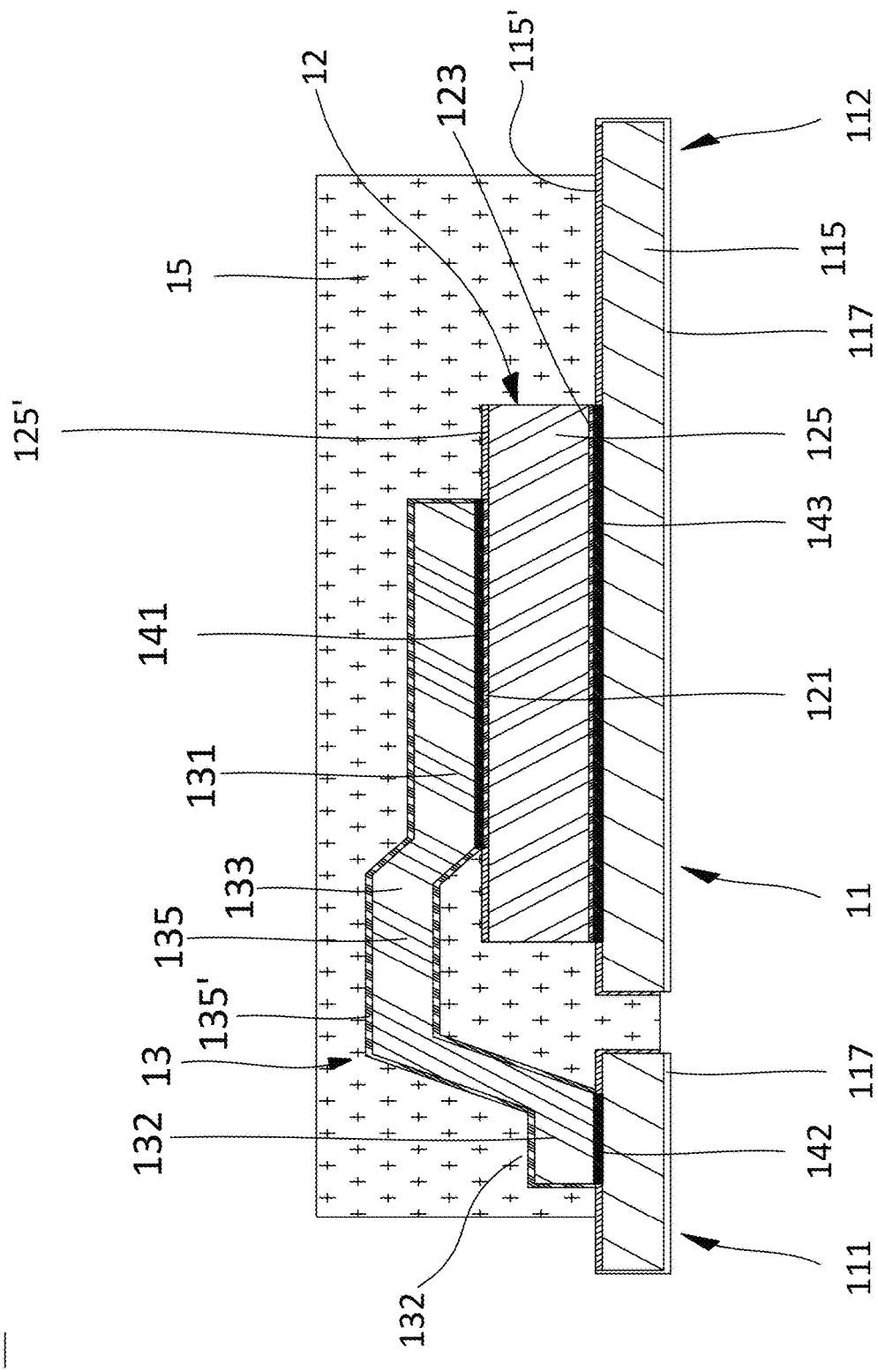
FIG. 1B shows a cross-sectional view of an example electronic device.

FIG. 1A shows a plan view of an example electronic device 10. FIG. 1B shows a cross-sectional view of an example electronic device 10.

In the example shown in FIG. 1A and FIG. 1B, electronic device 10 can comprise substrate 11, electronic component 12, encapsulant 15, interconnect 13, and bonds 141, 142, 143. Substrate 11 can comprise terminal 111 and pad 112, conductor material 115, and dielectric 115'. Electronic Component 12 can comprise component body 125, component terminals 121 and 123, and component dielectric 125'. Encapsulant 15 covers substrate 11, electronic component 12, and interconnect 13. Interconnect 13 can comprise conductor material 135 and dielectric 135'.

Substrate 11, encapsulant 15, and interconnect 13 can be referred to as a semiconductor package, and the package can protect electronic component 12 from external elements and/or environmental exposure. Substrate 11 and interconnect 13 can provide electrical coupling between an external component and electronic component 12.

FIGS. 2A, 2B, 2C, 2D, 2E, 2D, 2F, 2G, and 2H show cross-sectional views of an example method for manufacturing electronic device 10.

Figure 2A:
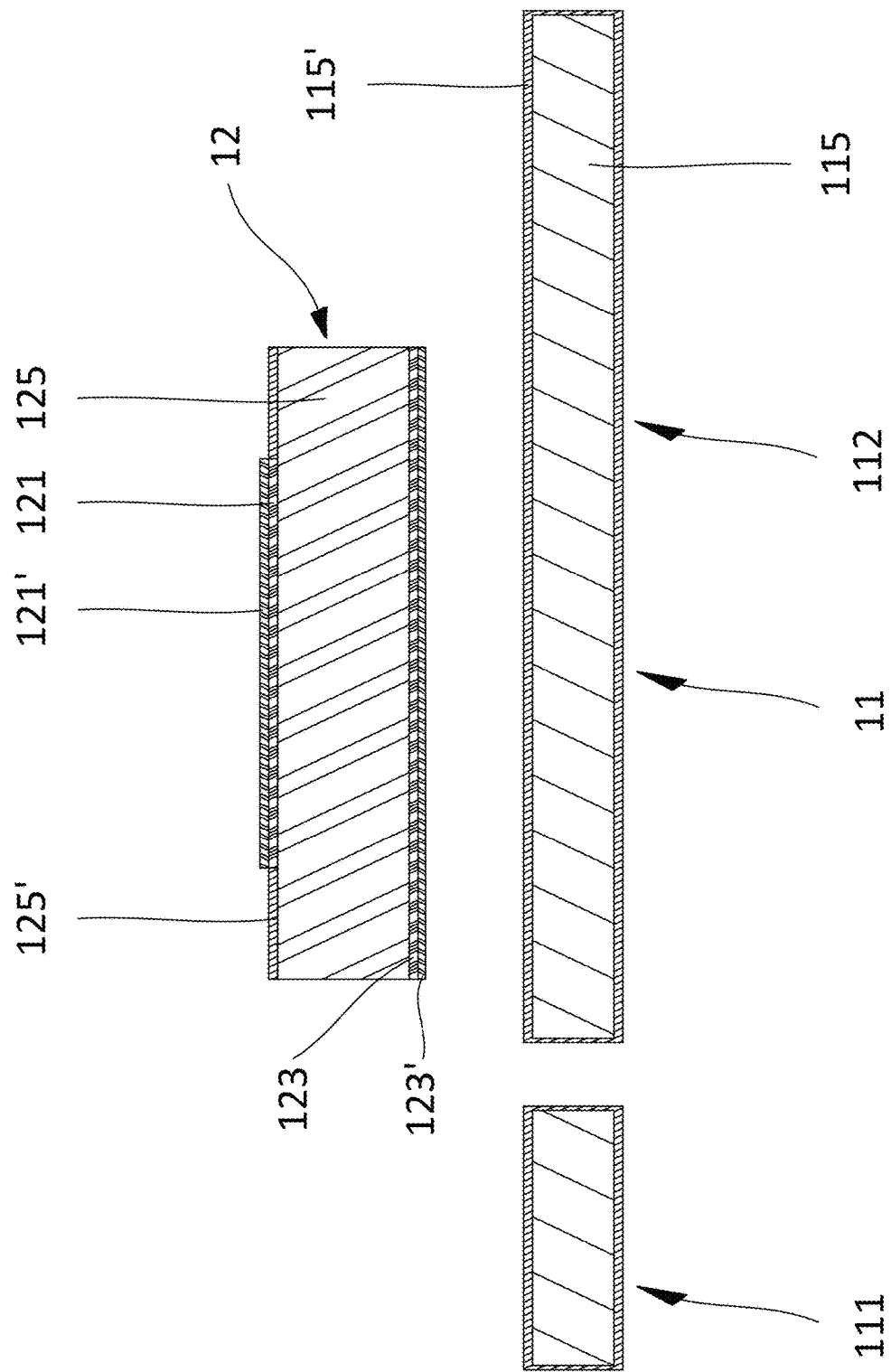
FIGS. 2A, 2B, 2C, 2D, 2E, 2F, 2G, and 2H show cross-sectional views of an example method for manufacturing an example electronic device.

FIG. 2A shows a cross-sectional view of electronic device 10 at an early stage of manufacture. In the example shown in FIG. 2A, substrate 11 can comprise terminal 111, pad 112, conductor material 115, and dielectric 115'. In some examples, substrate 11, terminal 111, and pad 112 can be provided with dielectric 115' surrounding or coating conductor material 115.

In some examples, substrate 11 can comprise or be referred to as a leadframe, a leadframe substrate, a printed circuit board, a printed wiring board, a rigid substrate, a flexible substrate, a pre-preg substrate, a cored substrate, a coreless substrate, a molded plastic substrate, a ceramic substrate, an etched foil process substrate, an additive process substrate, a buildup substrate, a pre-molded leadframe, or other substrates as known to one of ordinary skill in the art.

In some examples, substrate 11 can be a redistribution layer ("RDL") substrate. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. Thus, the dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride (Si3N4), silicon oxide (SiO2), and/or SiON. The inorganic dielectric layer(s) can be formed by growing the inorganic dielectric layers using an oxidation or nitridization process instead using photo-defined organic dielectric materials. Such inorganic dielectric layers can be filler-free without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate.

In other examples, substrate 11 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can be referred to as a printed circuit board (PCB) or a laminate substrate. Such pre-formed substrate can be formed through a semi-additive or modified-semi-additive process.

In some examples, terminal 111 can comprise a substantially flat upper side, a substantially flat lower side opposite to the upper side, and lateral sides between the upper and lower sides. Terminals 111 can be disposed substantially coplanar to each other, where a lateral side of terminal 111 faces, but is spaced apart from, a lateral side of pad 112. In some examples, terminal 111 can comprise or be referred to as a lead.

In some examples, pad 112 can comprise a substantially flat upper side, a substantially flat lower side opposite the upper side, and lateral sides between the upper and lower sides. In some examples, adjacent ends of pad 112 and terminal 111 can be spaced apart from each other, but other portions of pad 112 and terminal 111 can be initially coupled to each other through substrate 11, such as by a leadframe tie bar. Pad 112 can be structurally similar to terminal 111. In some examples, pad 112 can comprise or be referred to as a flag or paddle.

Terminal 111 and pad 112 are defined by different portions of conductor material 115. In some examples, conductor material 115 can comprise a substantially flat upper side, a substantially flat lower side opposite to the upper side, and lateral sides between the upper side and the lower side. Dielectric 115' can cover the upper side, the lower side, or the lateral sides of conductor material 115. In some examples, conductor material 115 can comprise or be referred to as a conductive structure, a conductive material, a conductive layer, a redistribution layer (RDL), a wiring pattern, a trace pattern, or a circuit pattern. In some examples, conductor material 115 can comprise copper, aluminum, gold, or silver. Illustratively, conductor material 115 can be provided or defined in any of a variety of ways, such as by stamping, punching, bending, pressing, etching, or plating. In some examples, the thickness of conductor material 115 can range from approximately 0.1 mm to 0.5 mm.

Dielectric 115' can coat or surround the exterior side of conductor material 115. For example, dielectric 115' can cover the upper side, lower side, or lateral sides of terminal 111, and dielectric 115' can cover the upper side, lower side, or lateral sides of pad 112. Electronic component 12 can be disposed on the upper side of dielectric 115' of substrate 11. In some examples, dielectric 115' can comprise an oxide or a native oxide of conductor material 115. In some examples, dielectric 115' can comprise an inorganic dielectric or an organic dielectric. In some examples, the thickness of dielectric 115' can be up to approximately 0.1 μm.

Electronic Component 12 can be disposed on the upper side of dielectric 115' of substrate 11. In some examples, electronic component 12 can comprise or be referred to as a die, a chip, or a semiconductor package. In some examples, electronic component 12 can comprise or be referred to as a power device or power semiconductor device such as a field-effect transistor (FET) or insulated-gate bipolar transistor (IGBT), a bipolar transistor device, or a thyristor device. Electronic component 12 can comprise component body 125, component terminals 121 and 123 respectively on top and bottom sides of component body 125, terminal dielectrics 121' and 123', and component dielectric 125' on the upper side of component body 125.

In some examples, the thickness of component body 125 can be in the range of approximately 50 μm to 800 μm. The size of component body 125 can be smaller than pad 112. Component terminal 121 and terminal dielectric 121' can be on an upper side of component body 125, and component terminal 123 and terminal dielectric 123' can be on a lower side of component body 125.

In some examples, component terminal 121 can comprise or be referred to as a source terminal or pad, or a gate terminal or pad. For example, current can be allowed to flow from a source terminal to a drain terminal (or vice versa) by a control signal provided to a gate terminal. In some examples, component terminal 121 can be a metallized structure comprising Cu, Au, Ni, Al, Ag, Ti, or Pd. In some examples, component terminal 121 can be provided or coated by deposition or plating. In some examples, the thickness of component terminal 121 can be up to approximately 10 μm. The area of component terminal 121 can be smaller than the area of component body 125.

Terminal dielectric 121' can be on the top side of component terminal 121. In some examples, terminal dielectric 121' can comprise oxide or native oxide resulting from oxidation of component terminal 121. In some examples, the thickness of terminal dielectric 121' can be up to approximately 0.1 μm.

Component dielectric 125' can be on the top side of component body 125 or on some or all exposed parts of component body 125. In some examples, component dielectric 125' can cover the exposed top side of component body 125. In some examples, component dielectric 125' can comprise or be referred to as an oxide or a die passivation. In some examples, component dielectric 125' can comprise an inorganic dielectric such as silicon oxide, silicon nitride, aluminum oxide, zirconium oxide, or hafnium oxide. In some examples, component dielectric 125' can be zirconium oxide in a polymer suspension (e.g., PVP). In some examples, component dielectric 125' can comprise polyimides, polymers, organic materials such as polyimide silicones, other silicones, elastomers, UV curable materials, thermosetting liquid crystal polymers such as polybenzoxazole (PBO), or combinations. In some examples, component dielectric 125' can be provided by deposition, dispensing, coating or screen-printing techniques, or cured after deposition. In some examples, the thickness of component dielectric 125' can be in the range of approximately 0.1 μm to 10 μm.

In some examples, component terminal 123 can be on the lower side of component body 125. In some examples, component terminal 123 can comprise or be referred to as a drain terminal or pad. For example, current can be allowed to flow from the source terminal to the drain terminal (or vice versa) by a control signal provided to the gate terminal. In some examples, component terminal 123 can be a metallized structure comprising Cu, Au, Ni, Al, Ag, Ti, or Pd. In some examples, component terminal 123 can be provided or coated by deposition or plating. In some examples, the thickness of component terminal 123 can be up to approximately 10 μm. The area of component terminal 123 can be substantially same as the area of the lower side of component body 125.

Terminal dielectric 123' can be on the lower side of component terminal 123. In some examples, terminal dielectric 123' can comprise oxide or native oxide resulting from oxidation of component terminal 123. In some examples, the thickness of terminal dielectric 123' can be up to approximately 0.1 μm.

Figure 2B:
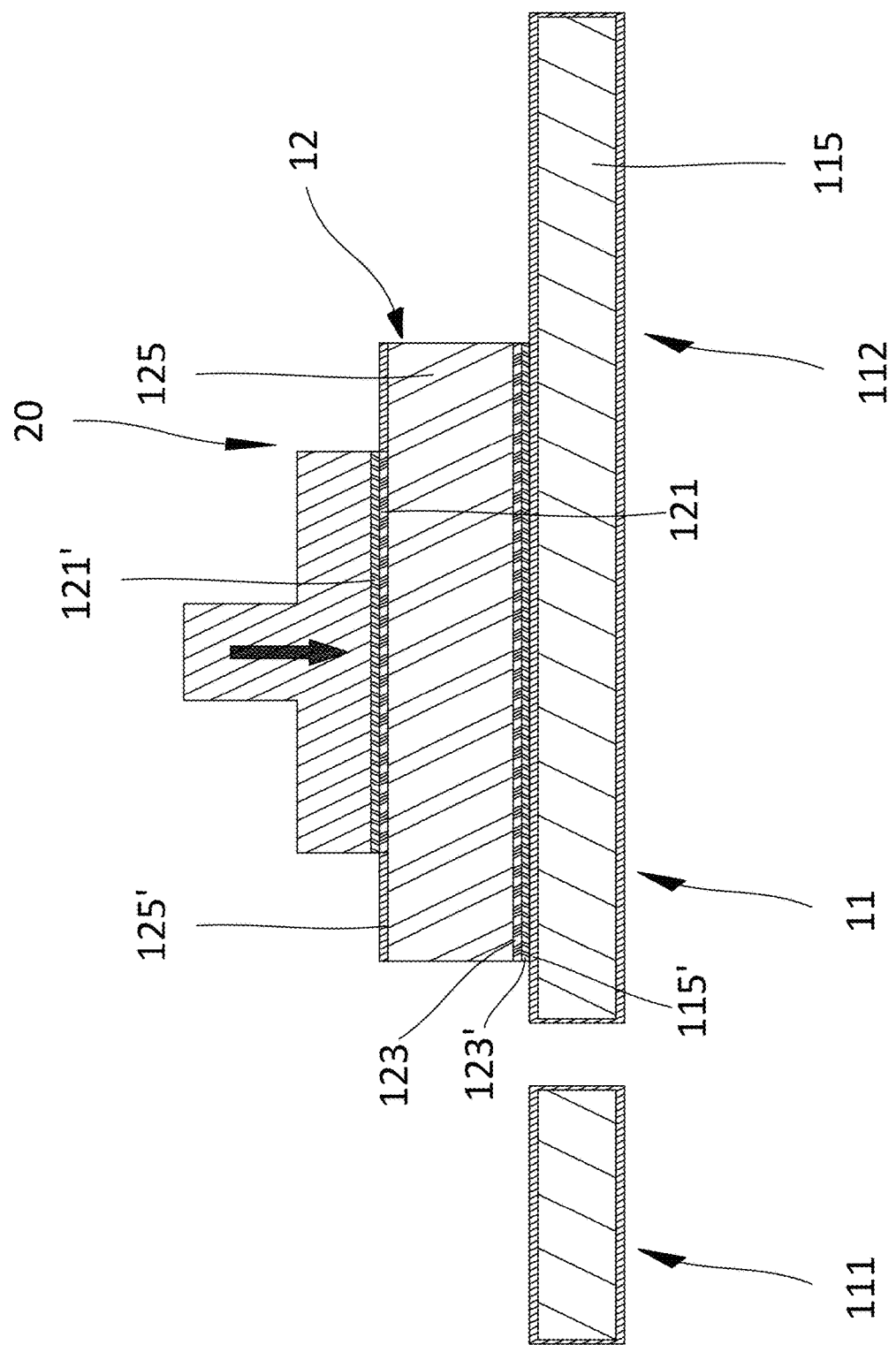
Figure 2C:
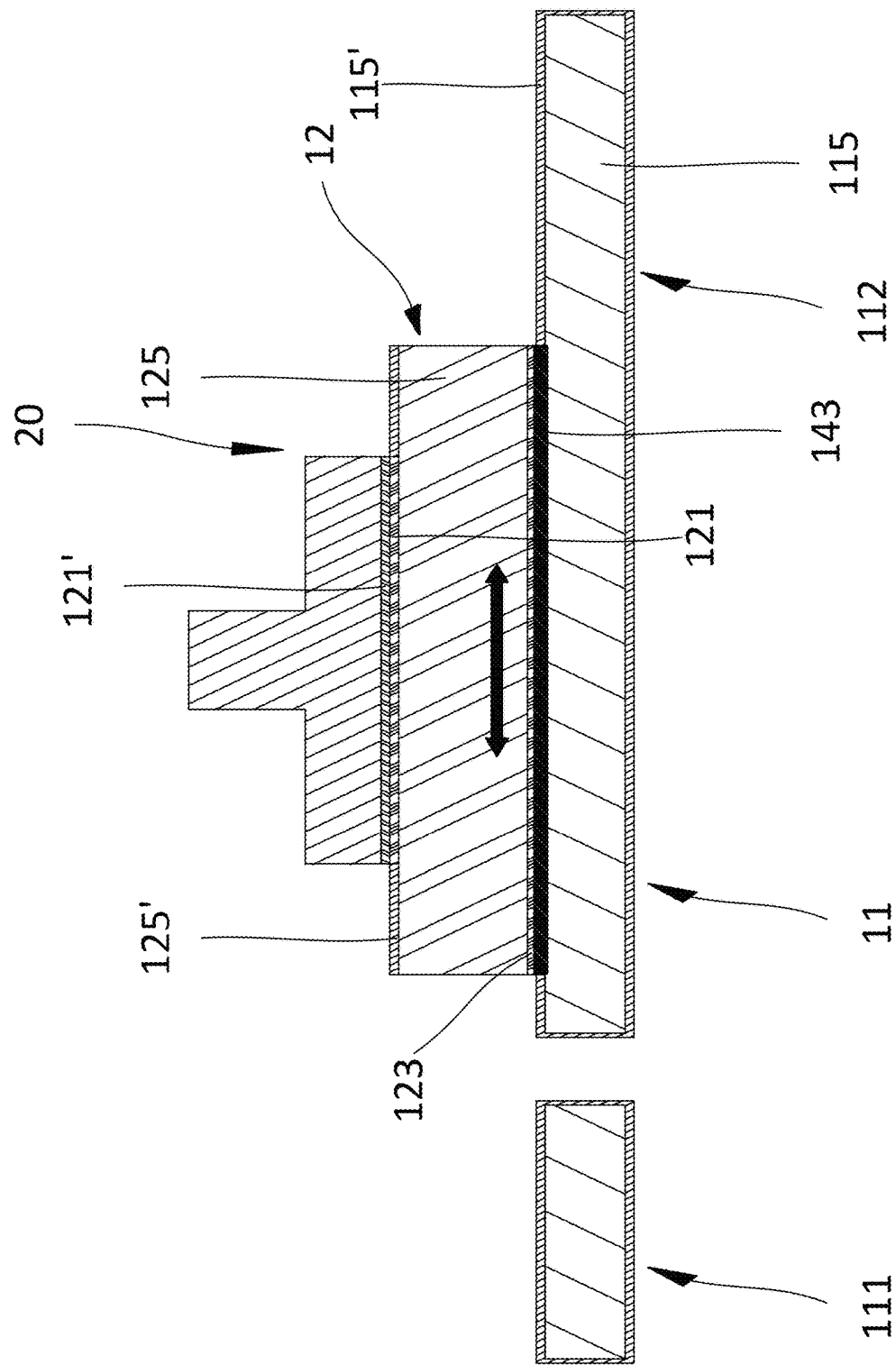

FIG. 2B and FIG. 2C each show a cross-sectional view of electronic device 10 at a later stage of manufacture. In the example shown in FIG. 2B, with electronic component 12 on substrate 11, ultrasonic vibration and pressure can be applied to the upper portion of electronic component 12, using ultrasonic bonding tool 20, to generate bond 143 that bonds pad 112 of substrate 11 with component terminal 123 of electronic component 12. Bonding tool 20 can cause electronic component 12 to vibrate back and forth, rubbing component terminal 123 against pad 112 of substrate 11 as illustrated by the arrow in FIG. 2C. Substrate 11 and electronic component 12 can be bonded to each other by ultrasonic vibration and pressure induced by bonding tool 20. Friction or heat caused by the ultrasonic bonding can cause terminal dielectric 123' and substrate dielectric 115' (FIG. 2B) to be removed or dislodged between component terminal 123 and pad 112, and can generate a direct weld or bond 143 (FIG. 2C) between terminal 123 and pad 112 without the use of solder, conductive film or paste, or other conductive agent in between. Such ultrasonic bonding can be described with reference to the illustrations and descriptions of zoomed-in FIG. 3A to 3D.

In some examples, bond 143 joining component terminal 123 of electronic component 12 with pad 112 of substrate 11 can be referred to as interatomic bond, intermetallic bond, solid phase bond, or solderless bond. In some examples, the area of bond 143 can substantially cover the area of the lower side of electronic component 12. In some examples, the thickness of bond 143 can range from 0 nm to 10 nm. In some examples, bond 143 can be diffused into or within one or both of component terminal 123 of electronic component 12 or pad 112 of substrate 11. FIG. 2C illustrates an example where after bond 143 is formed, dielectric 115' of substrate 11 laterally abuts bond 143 around a periphery of bond 143.

Figure 2D:
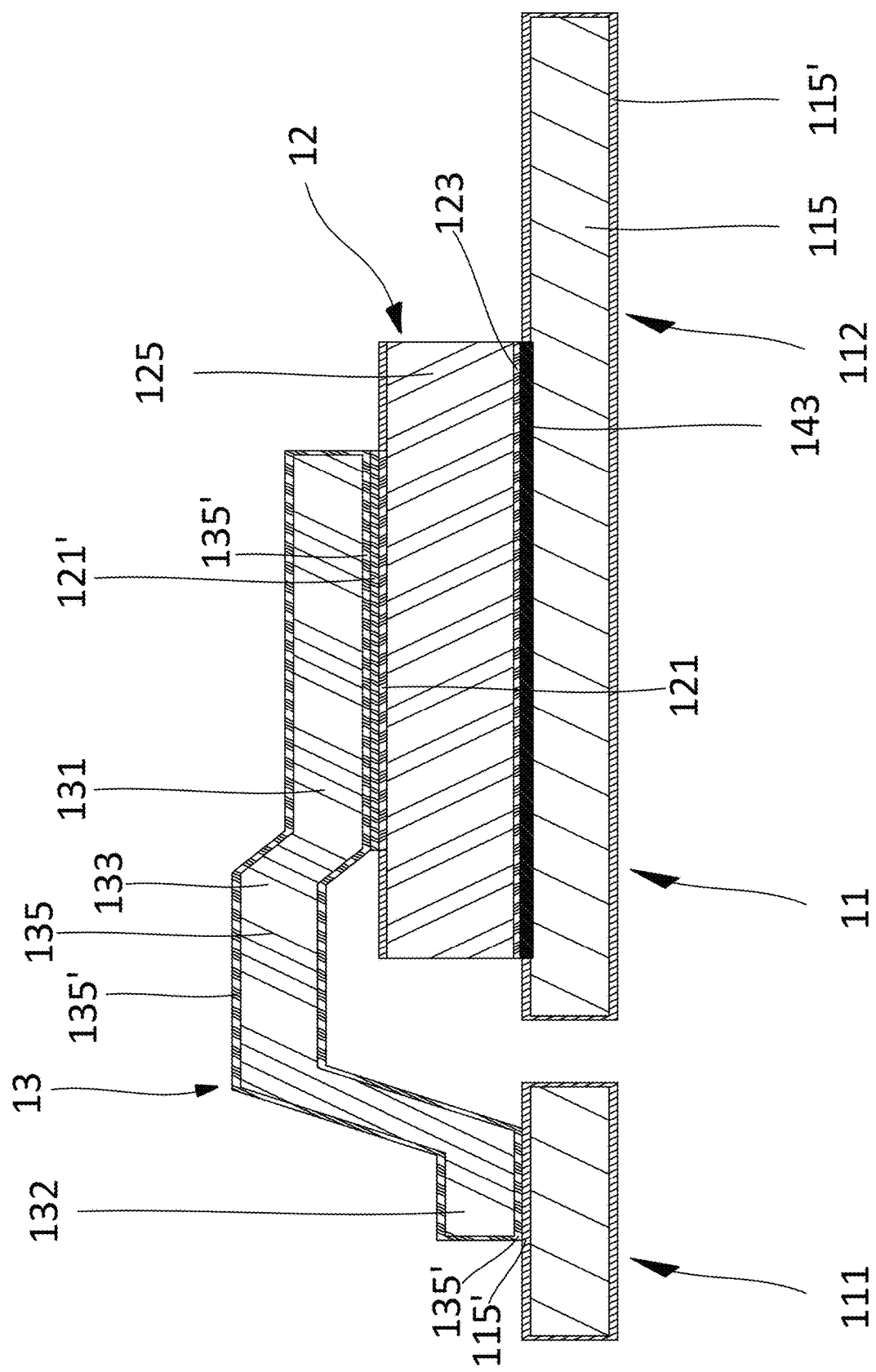

FIG. 2D shows a cross-sectional view of electronic device 10 at a later stage of manufacture. In the example shown in FIGS. 1A and 2D, interconnect 13 can be provided on the upper side of electronic component 12 and the upper side of terminal 111. In some examples, interconnect 13 can comprise or be referred to as a clip, a clip structure, a conductor, a conductive bridge, a conductive connector, a conductive bar, or a conductive interface. In some examples, interconnect 13 in FIG. 2D can comprise or represent source interconnect 13a or gate interconnect 13b in FIG. 1A. Correspondingly, component terminal 121 in FIG. 2D can comprise or represent a first current carrying terminal, such as a source terminal 121a or a control terminal, such as a gate terminal 121b of electronic component 12 in FIG. 1A. In some examples, the area of source interconnect 13a can be relatively larger than the size of gate interconnect 13b. Accordingly, a relatively larger current (e.g., source-drain current) can flow through source interconnect 13a, and a relatively smaller current (e.g., a gate control signal) can flow through gate interconnect 13b. In some examples, component terminal 123 can comprise or represent a second current carrying terminal, such as a drain terminal 123.

Interconnect 13 can comprise conductor material 135 and dielectric 135' covering conductor material 135. In some examples, conductor material 135 of interconnect 13 can be similar to conductor material 115 of substrate 11. In some examples, the manufacture or formation of conductor material 135 of interconnect 13 can also be similar to the manufacture or formation of conductor material 115 of substrate 11. In some examples, interconnect 13 can be defined by etching or by stamping. In some examples, the material of dielectric 135' of interconnect 13 can be similar to dielectric 115' of substrate 11.

In some examples, conductor material 135 can comprise component end 131 and substrate end 132 joined by interconnect bridge 133. Component end 131 can be coupled over to the top side of electronic component 12, and substrate end 132 can be coupled over the top side of terminal 111 of substrate 11. In some examples, the height of interconnect bridge 133 can be different, whether higher or lower, than that of component end 131. Accordingly, interconnect 13 can comprise an inclined leg between interconnect bridge 133 and component end 131. In some examples, the height of interconnect bridge 133 can be relatively higher than that of substrate end 132. Accordingly, interconnect 13 can comprise an inclined leg between interconnect bridge 133 and substrate end 132.

Figure 2E:
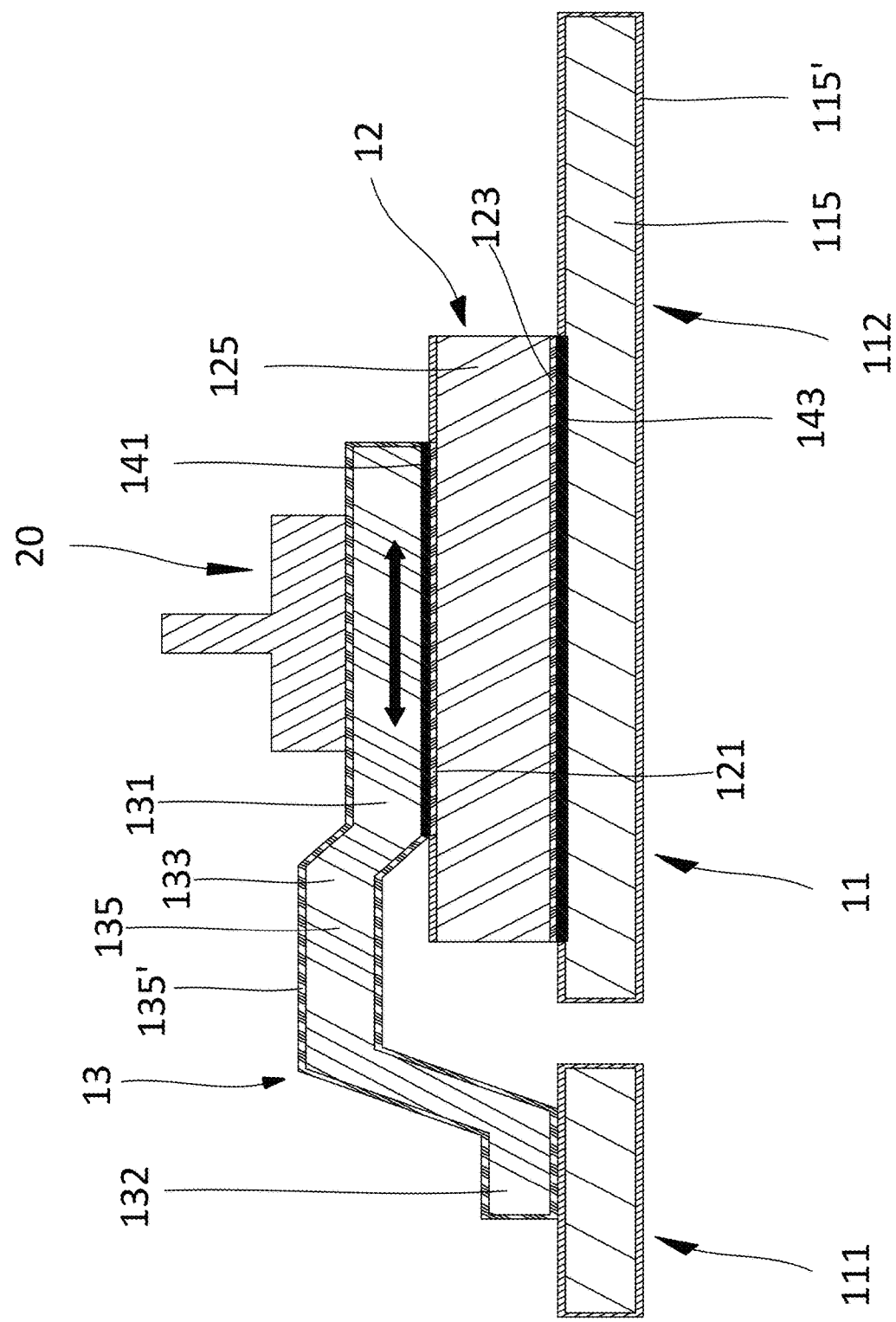

FIG. 2E shows a cross-sectional view of electronic device 10 at a later stage of manufacture. In the example shown in FIG. 2E, component end 131 of interconnect 13 is on the upper side of electronic component 12, and ultrasonic vibration and pressure can be applied to component end 131, using ultrasonic die bonding tool 20, to generate bond 141 that bonds component end 131 of interconnect 13 with component terminal 121 of electronic component 12. In some examples, such bonding can be similar to that described with respect to FIGS. 2B-2C for bond 143 between pad 112 of substrate 11 and component terminal 123 of electronic component 12.

Bonding tool 20 can cause component end 131 of interconnect 13 to vibrate back and forth, rubbing component end 131 of interconnect 13 against component terminal 121 of electronic component 12 as illustrated by the arrow in FIG. 2E. Interconnect 13 and electronic component 12 can be bonded to each other by ultrasonic vibration and pressure induced by bonding tool 20. Friction or heat caused by the ultrasonic bonding can cause terminal dielectric 121' and interconnect dielectric 135' (FIG. 2D) to be removed or dislodged between component end 131 and component terminal 121, and can generate a direct weld or bond 141 (FIG. 2E) between component end 131 and component terminal 121 without the use of solder, conductive film or paste, or other conductive agent in between. Such ultrasonic bonding can be described with reference to the illustrations and descriptions of zoomed-in FIG. 3A to 3D.

In some examples, bond 141 joining component end 131 of interconnect 13 with component terminal 121 of electronic component 12 can be referred to as interatomic bond, intermetallic bond, solid phase bond, or solderless bond. In some examples, the area of bond 141 can substantially cover the area of component terminal 121. In some examples, the thickness of bond 141 can range from 0 nm to 10 nm. In some examples, bond 141 can be diffused into or within one or both of component end 131 of interconnect 13 or component terminal 121 of electronic component 12.

Figure 2F:
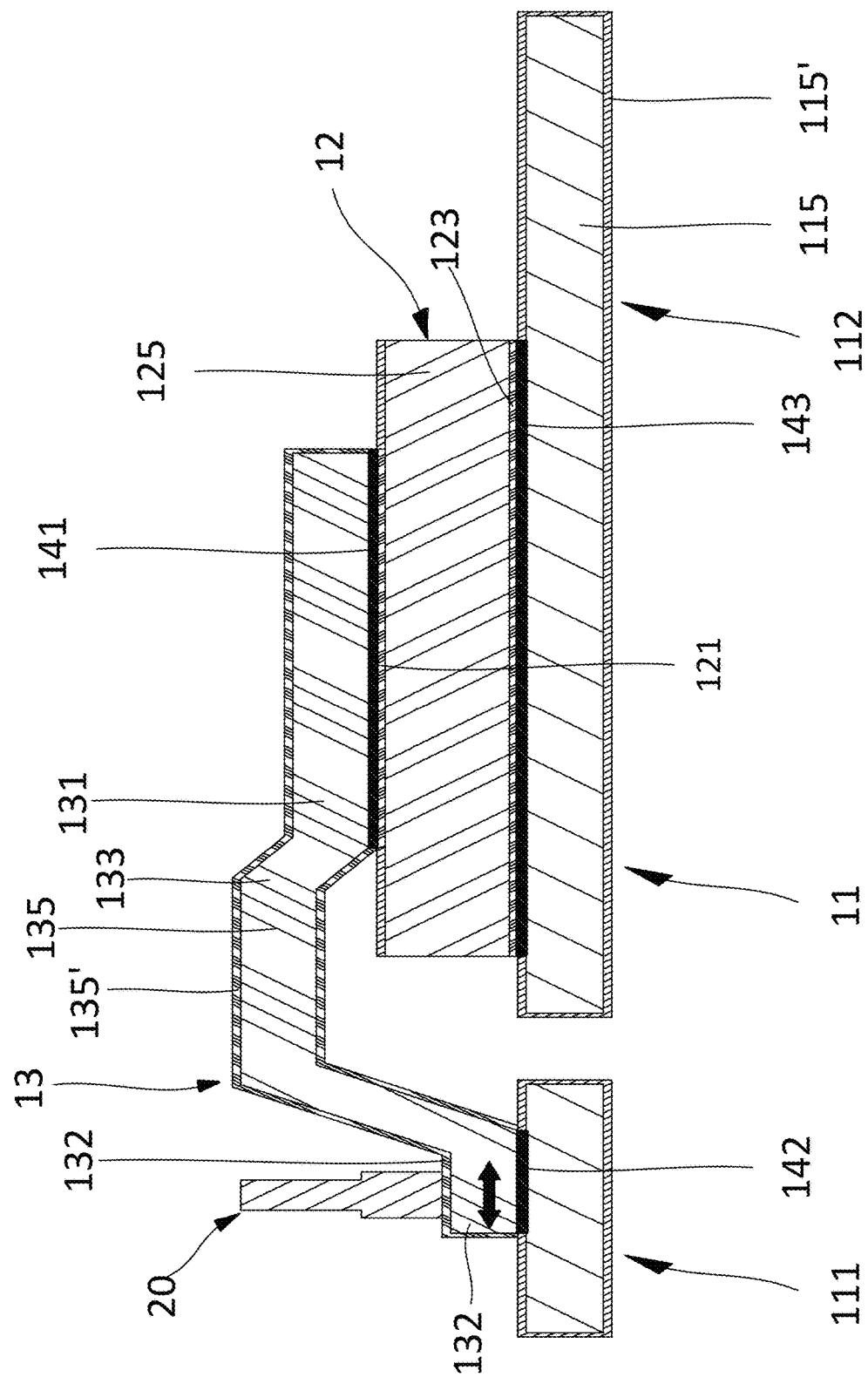

FIG. 2F shows a cross-sectional view of electronic device 10 at a later stage of manufacture. In the example shown in FIG. 2F, substrate end 132 of interconnect 13 is on the upper side of terminal 111 of substrate 11, and ultrasonic and pressure can be applied to substrate end 132, using ultrasonic die bonding tool 20, to generate bond 142 that bonds substrate end 132 of interconnect 13 with terminal 111 of substrate 11. In some examples, such bonding can be similar to that described with respect to FIGS. 2B-2C for bond 143 between pad 112 of substrate 11 and component terminal 123 of electronic component 12.

Bonding tool 20 can cause substrate end 131 of interconnect 13 to vibrate back and forth, rubbing substrate end 131 of interconnect 13 against terminal 111 of substrate 11 as illustrated by the arrow in FIG. 2F. Interconnect 13 and substrate 11 can be bonded to each other by ultrasonic vibration and pressure induced by bonding tool 20. Friction or heat caused by the ultrasonic bonding can cause substrate dielectric 115' and interconnect dielectric 135' (FIG. 2D) to be removed or dislodged between substrate end 132 and terminal 111, and can generate a direct weld or bond 142 (FIG. 2F) between substrate end 132 and terminal 111 without the use of solder, conductive film or paste, or other conductive agent in between. Such ultrasonic bonding can be described with reference to the illustrations and descriptions of zoomed-in FIG. 3A to 3D.

Figure 2G:
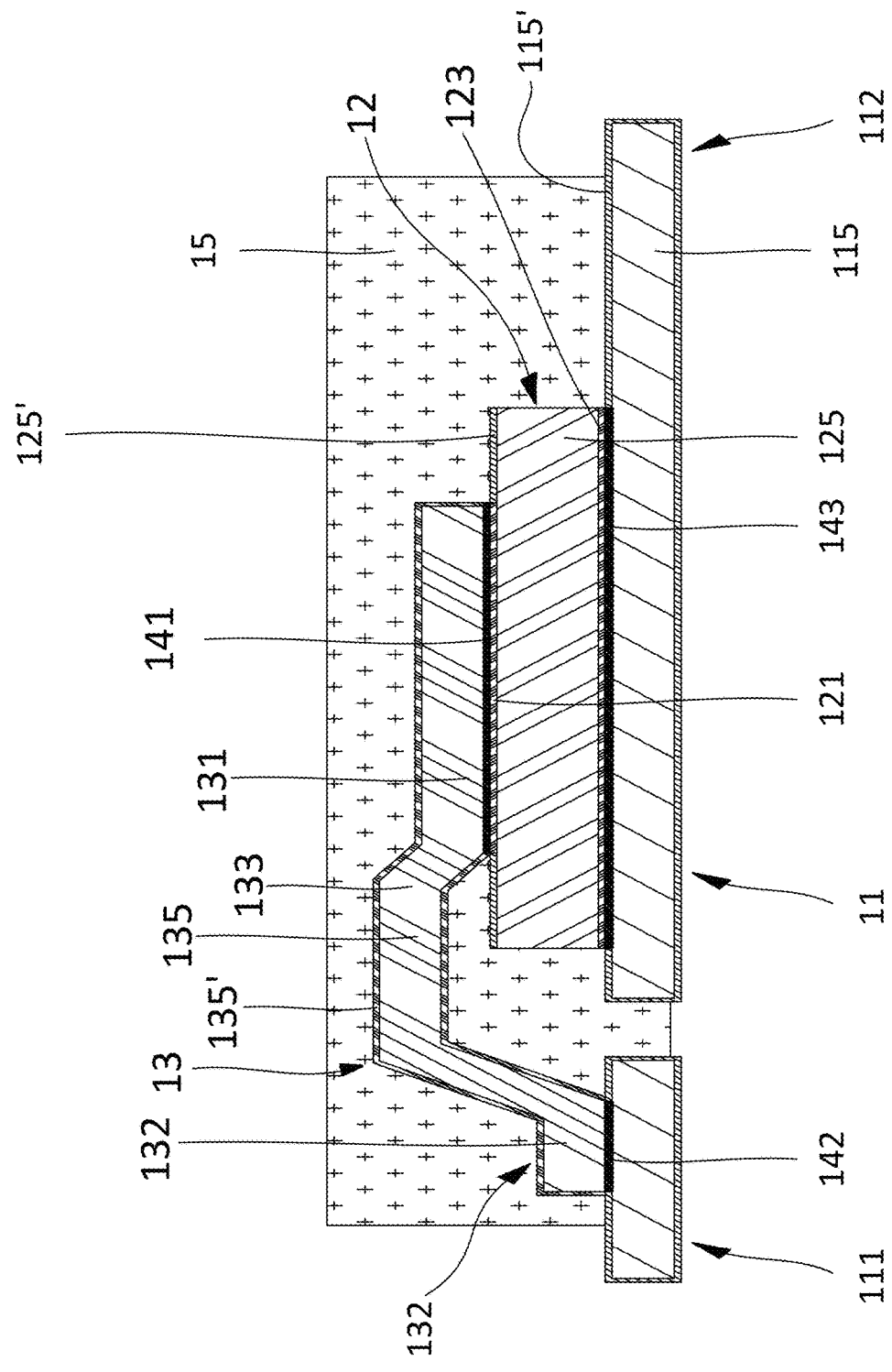

In some examples, bond 142 joining substrate end 132 of interconnect 13 with terminal 111 of substrate 11 can be referred to as interatomic bond, intermetallic bond, solid phase bond, or solderless bond. In some examples, the thickness of bond 142 can range from 0 nm to 10 nm. In some examples, bond 142 can be diffused into or within one or both of substrate end 132 of interconnect 13 or terminal 111 of substrate 11. FIG. 2G illustrates an example where after bond 142 is formed, dielectric 115' of substrate 11 laterally abuts bond 142 around a periphery of bond 142.

FIG. 2G shows a cross-sectional view of electronic device 10 at a later stage of manufacture. In the example shown in FIG. 2G, encapsulant 15 can be provided to cover the upper side of substrate 11, electronic component 12, and interconnect 13. Bottom sides and lateral sides of terminal 111 and pad 112 of substrate 11 can remain exposed from encapsulant 15. Encapsulant 15 can extend to fully cover the upper sides of terminal 111 or pad 112 of substrate 11 in some implementations.

In some examples, encapsulant 15 can comprise or be referred to as an epoxy molding compound, an epoxy molding resin, or a sealant. In some examples, encapsulant 15 can comprise or be referred to as a molding part, a sealing part, an encapsulation part, a protection part, or a body. In some examples, encapsulant 15 can comprise organic resins, inorganic fillers, curing agents, catalysts, coupling agents, colorants and/or flame retardants. In some examples, encapsulant 15 can be provided by compression molding, transfer molding, liquid encapsulant molding, vacuum lamination, paste printing or film assist molding. For example, a thickness of encapsulant 15 can be in the range of approximately 0.5 mm to 3.5 mm. In some examples, a portion of the top side of interconnect 13 can be exposed from encapsulant 15.

Figure 2H:
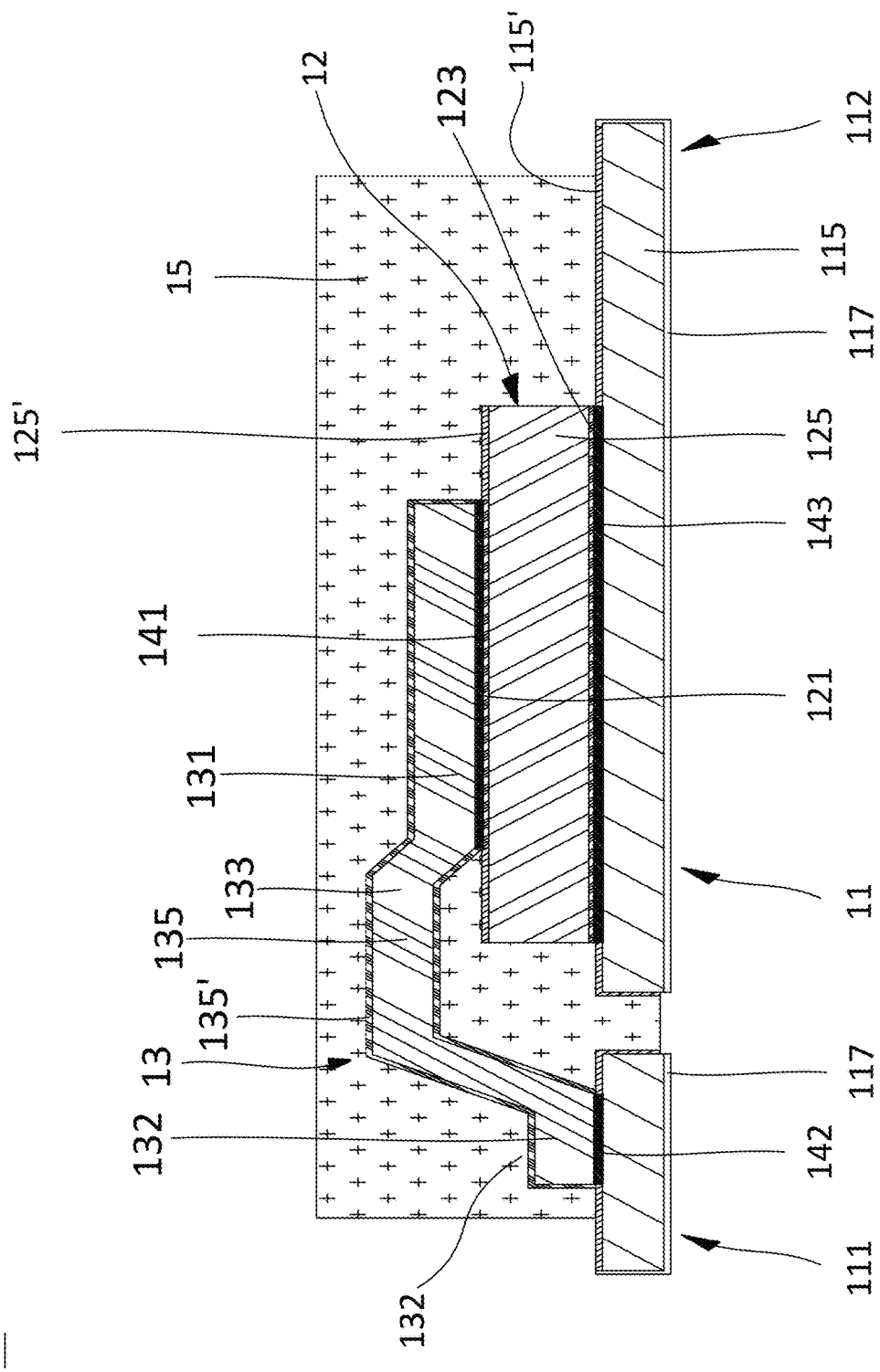

FIG. 2H shows a cross-sectional view of electronic device 10 at a later stage of manufacture. In the example shown in FIG. 2H, conductive coating 117 can be provided on exposed portions substrate 11, such as on lower sides or lateral sides of terminal 111 or pad 112 of substrate 11.

In some examples, portions of dielectric 115' can be removed from exposed portions of substrate 11 before applying conductive coating 117, while portions of dielectric 115' can remain covering portions of substrate 11 that are encapsulated by encapsulant 15. In some examples, portions of dielectric 115' can remain on some exposed portions of substrate 11, such as on exposed portions of the upper sides of terminal 111 or pad 112. In some examples, dielectric 115' can be removed from exposed portions of the upper sides of terminal 111 or pad 112, which can also be coated by conductive coating 117.

A material of conductive coating 117 can comprise solder, a solder-wettable conductor, Ag, Ti, Pd, Au, or Ni. In some examples, conductive coating 117 can be applied by plating, whether electrolytic or electroless. In some examples, the thickness of conductive coating 117 can range from approximately 1 μm to 30 μm.

FIGS. 3A, 3B, 3C, and 3D show magnified cross-sectional views of an example method of ultrasonic bonding for manufacturing an example electronic device. Such views can correspond to the formation of ultrasonic bonds 141, 142, 143 described for electronic device 10 throughout FIGS. 1-2.

In some examples, with respect to the formation of bond 143 (FIGS. 2B, 2C), element 38 with dielectric 38' can correspond to component terminal 123 of electronic component 12 with dielectric 123', while element 39 with dielectric 39' can correspond to pad 112 of substrate 11 with substrate dielectric 115'.

In some examples, with respect to the formation of bond 141 (FIGS. 2D, 2E), element 38 with dielectric 38' can correspond to component end 131 of interconnect 13 with dielectric 135', while element 39 with dielectric 39' can correspond to component terminal 121 of electronic component 12 with dielectric 121'.

In some examples, with respect to the formation of bond 142 (FIGS. 2D, 2F), element 38 with dielectric 38' can correspond to substrate end 132 of interconnect 13 with dielectric 135', while element 39 with dielectric 39' can correspond to terminal 111 of substrate 11 with substrate dielectric 115'.

Figure 3B:
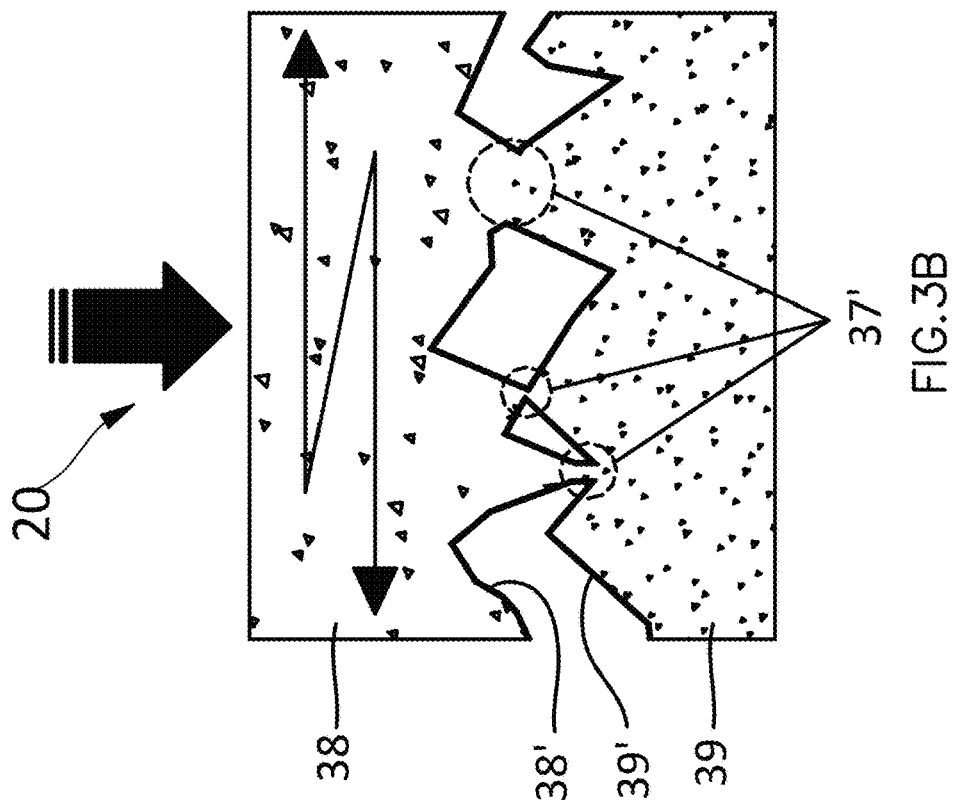
Figure 3A:
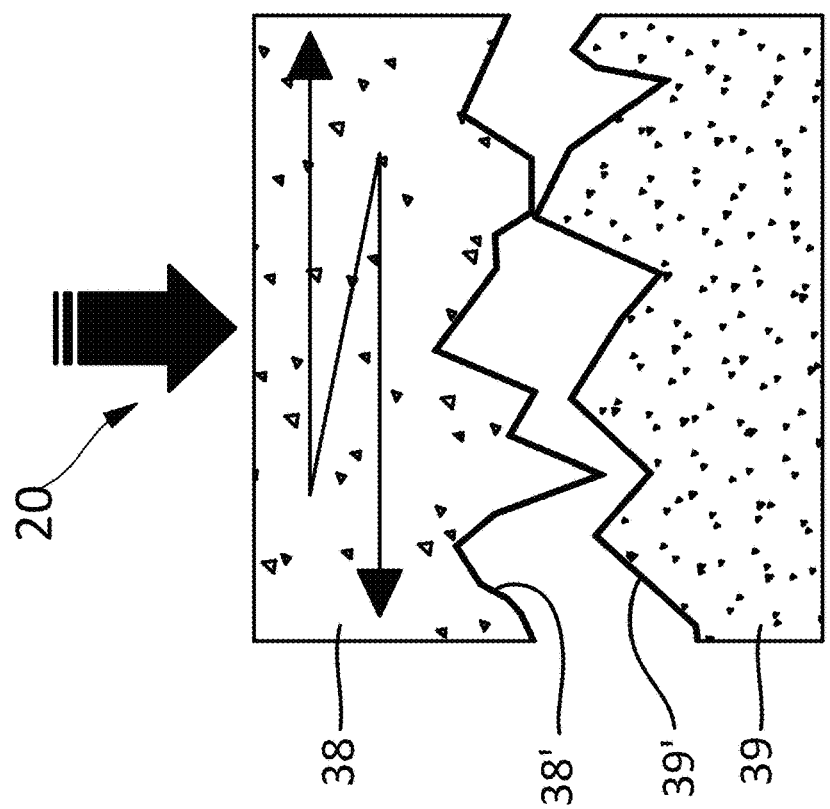

FIG. 3A shows a cross-sectional view of a portion of electronic device 10 at an early stage of ultrasonic bonding. In the example in FIG. 3A, element 38 can be positioned on element 39 such that ultrasonic vibration or pressure can be applied on element 38 against element 39. In some examples, element 38 and element 39 comprise different conductive materials including different metals.

As seen in the magnified view, irregular or jagged surfaces can initially exist between element 38 and element 39. At the boundary between dielectric 38' and dielectric 39', there can be parts that are in contact with each other and parts that are not in contact with each other. Ultrasonic vibration and pressure can be applied on the upper portion of element 38. In some examples, ultrasonic frequency applied can be in the range of 20 kHz-60 kHz. In some examples, pressure applied can be in the range of be 1N to 1000N.

In the example shown in FIG. 3B, when the ultrasonic vibration and pressure is applied to element 38, the irregular surfaces of dielectric 38' and dielectric 39' can be rubbed against each other and eventually start to be removed or dislodged from elements 38 and element 39 by friction. Where dielectrics 38' and 39' are removed, the conductive materials of elements 38 and 39 contact each other and the ultrasonic vibration and pressure begin creating welding points 37' at such contacts between elements 38 and 39.

In the example shown in FIG. 3C, the applied ultrasonic vibration and pressure continue, removing further dielectrics 38' and 39', enlarging the welding points 37', and planarizing the irregular surfaces between elements 38 and 39.

In the examples shown in FIG. 3D, bond 37 is finalized between elements 38 and 39, with dielectrics 38' and 39' removed, and with welding points 37' merged to define bond 37 as a continuous bond. In some examples, bond 37 can correspond to any of bonds 141, 142, 143 (FIGS. 1-2). In some examples, the formation of bond 37 can induce conductive material or particles of element 38 to diffuse into element 39, or vice-versa. In some examples, such bond 37 can comprise or be referred to as an intermetallic bond. Accordingly, dielectrics 38' and 39' can be removed or dislodged from both the upper side of element 39 and the lower side of element 38, elements 38 and 39 can be securely bonded to each other by bond 37. In some examples, bond 37 can comprise or be referred to as a solderless bond, an interatomic bond, a solid-phase bond, a low-temperature bond, an ultrasonic bond, or a thermo-compression bond.

In accordance with the present description, conductor material 115 can be a different material than the material of component terminal 123, and conductor material 135 can be a different material than component terminal 121. Component terminals 121 and 123 can be the same or different materials. Conductor material 115 and conductor material 135 can be the same or different materials. Component terminals 121a and 121b can be the same material or a different material. In some examples, different materials includes materials having at least one different constituent material that is present above industry accepted background impurity levels.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. A semiconductor device, comprising:
   a substrate comprising:
      a substrate conductor material;
      a terminal;
      a pad; and
      a substrate dielectric over the substrate conductor material;
   an electronic component comprising:
      an electronic component top side;
      an electronic component bottom side opposite to the electronic component top side;
      a first component terminal comprising a first component terminal conductor material adjacent to the electronic component top side; and
      a second component terminal comprising a second component terminal material adjacent to the electronic component bottom side; and
   an interconnect comprising:
      an interconnect conductor material;
      a component end; and
      a substrate end;
   wherein:
      the second component terminal is attached to the pad with a first intermetallic bond;
      the first intermetallic bond extends downward through the substrate dielectric;
      the component end of the interconnect is attached to the first component terminal with a second intermetallic bond; and
      the substrate end of the interconnect is attached to the terminal with a third intermetallic bond.

2. The semiconductor device of claim 1, wherein:
   the first component terminal conductor material and the interconnect conductor material are different materials.

3. The semiconductor device of claim 1, wherein:
   the substrate dielectric laterally abuts the first intermetallic bond at a periphery of the first intermetallic bond.

4. The semiconductor device of claim 1, wherein:
   the interconnect comprises a clip; and
   the substrate comprises a leadframe.

5. The semiconductor device of claim 1, wherein:
   the first intermetallic bond, the second intermetallic bond, and the third intermetallic bond are ultrasonic bonds.

6. The semiconductor device of claim 1, further comprising:
   an encapsulant covering the electronic component, the interconnect, and an upper side of the substrate;
   wherein:
      a portion of the terminal and the pad are exposed from the encapsulant.

7. The semiconductor device of claim 1, wherein:
   the substrate comprises a second terminal;
   the electronic component comprises a third component terminal;
   the semiconductor device further comprises a second interconnect comprising a second interconnect conductor material and having a second interconnect substrate end and a second interconnect component end;
   the second interconnect substrate end is attached to the second terminal with a fourth intermetallic bond; and
   the second interconnect component end is attached to the third component terminal with a fifth intermetallic bond.

8. A method of manufacturing a semiconductor device, comprising:
   providing a substrate comprising a substrate conductor material and a substrate dielectric over the substrate conductor material;
   providing an electronic component comprising:
      a first component terminal comprising:
         a first component terminal conductor material; and
         a first component terminal dielectric over the first component terminal conductor material;
      and
      a second component terminal comprising:
         a second component terminal conductor material; and
         a second component terminal dielectric over the second component terminal conductor material;
   providing an interconnect comprising:
      a interconnect conductor material;
      a component end;
      a substrate end; and
      an interconnect dielectric over the interconnect conductor material;
   attaching the second component terminal to the substrate by forming a first intermetallic bond;
   attaching the component end of the interconnect to the first component terminal by forming a second intermetallic bond; and
   attaching the substrate end of the interconnect to the substrate by forming a third intermetallic bond, wherein:
   attaching the second component terminal to the substrate comprises using ultrasonic vibrations applied to the electronic component and the substrate without first removing the substrate dielectric;
   using the ultrasonic vibrations comprises:
      using the ultrasonic vibrations to remove the substrate dielectric and the second component terminal dielectric;
      forming weld points between the substrate conductor material and the second component terminal conductor material; and
      merging the weld points to form the first intermetallic bond as a continuous bond; and
   the substrate dielectric abuts edges of the first intermetallic bond after attaching the second component terminal.

9. The method of claim 8, wherein:
   attaching the second component terminal to the substrate comprises using an ultrasonic frequency in a range of 20 kHz to 60 kHz.

10. The method of claim 9, wherein:
attaching the second component terminal to the substrate comprises applying a downward pressure to the electronic component while using the ultrasonic vibrations; and
applying the downward pressure comprises applying the downward pressure in a range of 1 N to 1000 N.

11. The method of claim 8, further comprising:
providing an encapsulant covering the electronic component, the interconnect, and an upper side of the substrate.

12. The method of claim 8, wherein:
providing the substrate comprises providing a first terminal, a second terminal, and a pad;
attaching the second component terminal to the substrate comprises attaching the second component terminal to the pad;
attaching the substrate end of the interconnect to the substrate comprises attaching the substrate end of the interconnect to the first terminal;
providing the electronic component comprises providing the electronic component with a third component terminal comprising a third component terminal conductor material; and
the method further comprises:
providing a second interconnect comprising a second interconnect conductor material and having a second interconnect substrate end and a second interconnect component end;
attaching the second interconnect component end to the third component terminal by forming a fourth intermetallic bond; and
attaching the second interconnect substrate end to the second terminal by forming a fifth intermetallic bond.

13. The method of claim 12, wherein:
providing the interconnect comprises providing a first clip;
providing the second interconnect comprises a providing a second clip; and
providing the electronic component comprises:
providing a power semiconductor device;
providing the first component terminal comprising a first current carrying terminal;
providing the second component terminal comprising a second current carrying terminal; and
providing the third component terminal comprising a control terminal.

14. The method of claim 8, wherein:
the first intermetallic bond, the second intermetallic bond, and the third intermetallic bond are solderless bonds.

15. A method of manufacturing a semiconductor device, comprising:
providing a substrate comprising a substrate conductor material and a substrate dielectric over the substrate conductor material;
providing an electronic component comprising:
a first component terminal comprising:
a first component terminal conductor material; and
a first component terminal dielectric over the first component terminal conductor material;
and
a second component terminal comprising:
a second component terminal conductor material; and
a second component terminal dielectric over the second component terminal conductor material;
providing a first clip comprising:
a first clip conductor material;
a component end;
a substrate end; and
a first clip dielectric over the first clip conductor material;
attaching the second component terminal to the substrate by forming a first intermetallic bond;
attaching the component end of the first clip to the first component terminal by forming a second intermetallic bond; and
attaching the substrate end of the first clip to the substrate by forming a third intermetallic bond, wherein:
attaching the second component terminal to the substrate comprises using ultrasonic vibrations and a downward pressure applied to the electronic component and the substrate without first removing the substrate dielectric and the second component terminal dielectric;
using the ultrasonic vibrations and the downward pressure comprises:
using the ultrasonic vibrations and the downward pressure to frictionally remove the substrate dielectric and the second component terminal dielectric;
forming weld points between the substrate conductor material and the second component terminal conductor material; and
merging the weld points to form the first intermetallic bond as a continuous bond; and
the substrate dielectric abuts edges of the first intermetallic bond after attaching the second component terminal.

16. The method of claim 15, wherein:
attaching the second component terminal to the substrate comprises using an ultrasonic frequency in a range of 20 kHz to 60 KHz.

17. The method of claim 15, wherein:
attaching the second component terminal to the substrate comprises applying the downward pressure in a range of 1N to 1000 N.

18. The method of claim 15, further comprising:
providing an encapsulant covering the electronic component, the first clip, and an upper side of the substrate, wherein:
a portion of the substrate is exposed from the encapsulant.

19. The method of claim 18, further comprising:
providing a conductive coating disposed over the portion of the substrate exposed from the encapsulant.

20. The method of claim 15, wherein:
providing the substrate dielectric comprises providing an organic dielectric.

* * * * *